United States Patent
Holloway et al.

(10) Patent No.: US 7,504,713 B2
(45) Date of Patent: Mar. 17, 2009

(54) PLASTIC SEMICONDUCTOR PACKAGES HAVING IMPROVED METAL LAND-LOCKING FEATURES

(75) Inventors: Jeffrey Gail Holloway, Plano, TX (US); Steven Alfred Kummerl, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 58 days.

(21) Appl. No.: 11/623,374

(22) Filed: Jan. 16, 2007

(65) Prior Publication Data
US 2008/0169554 A1 Jul. 17, 2008

(51) Int. Cl.
*H01L 23/495* (2006.01)

(52) U.S. Cl. .................. 257/666; 257/674; 257/698; 257/787

(58) Field of Classification Search .......... 257/666–786
See application file for complete search history.

(56) References Cited

U.S. PATENT DOCUMENTS

| | | | |
|---|---|---|---|
| 6,693,350 B2 | 1/2004 | Teshima et al. | |
| 6,791,195 B2 | 9/2004 | Urushima | |
| 6,909,166 B2 * | 6/2005 | Frezza et al. | 257/666 |

* cited by examiner

*Primary Examiner*—N Drew Richards
*Assistant Examiner*—Mamadou Diallo
(74) *Attorney, Agent, or Firm*—Yingsheng Tung; Wade J. Brady, III; Frederick J. Telecky, Jr.

(57) ABSTRACT

A semiconductor device having a plastic package with a linear array of metal lands (202, 212) with parallel perimeter portions (203a, 213a). Pairs of adjacent lands have their facing parallel perimeter portions oriented in parallel, defining a centerline. The land perimeters have flanges remote from the surface, each flange shaped by an outline. For adjacent lands, the flanges (207b, 218, 219) of the parallel perimeter portions have asymmetrical outlines relative to the centerline and are in concord so that alternately the flange of one land diminishes its outline where the flange of the adjacent land protrudes its outline. This coordinated variation shapes the space between the adjacent flanges in a meander-like mode. Adhesive plastic material is anchored in the space to hinder a land shift along the parallel perimeter portions.

15 Claims, 5 Drawing Sheets

PLASTIC SEMICONDUCTOR PACKAGES HAVING IMPROVED METAL LAND-LOCKING FEATURES

FIELD OF THE INVENTION

The present invention is related in general to the field of semiconductor devices and processes and more specifically to the structure and fabrication method of no-lead metal carriers, suitable for superior molding compound adhesion, for integrated circuit devices.

DESCRIPTION OF THE RELATED ART

There is increased interest in the semiconductor industry in Small Outline No-lead (SON) and Quad Flat Pack No-lead (QFN) package types because of their near chip-size dimensions and lower material content and cost. These packages do not have leads, per se, but only land areas that are exposed on the bottom side of the package. The solder joint is made to these land areas. A couple of issues with this type of package is mold compound adhesion and moisture performance.

QFN and SON devices are subject to thermo-mechanical stresses, when they are subjected to solder mounting on substrates such as printed circuit boards, to temperature cycling in accelerated reliability tests, to operational life including temperature variations, and related other temperature and environmental changes. These stresses can cause failure of the connections between the metal lead (typically a metal land) and the plastic package body; the lands at the package corners usually receive the severest stress and are thus most likely to fail. As a frequent failure mechanism, a metal land may delaminate from the plastic material and fall away from the package. In another frequent failure mechanism, a metal land may shift or tilt and brake away from the solder connection; the break-away sometimes involves the cracking of the solder joint.

The trend of miniaturization in semiconductor technology aggravates the risk situation. This trend requires not only the semiconductor chips to shrink, but also the device packages. As a consequence, the metal lands of packages are also shrinking in size, and adjacent lands are getting more crowded close together, leaving less and less plastic material and its stress-mitigating characteristic between the metal lands. With thermo-mechanical stresses operating at full force, contact land and package failures become more prevalent. With this trend, it also becomes more difficult to provide the adhesion between the plastic material and the metal lands needed to prevent package delamination.

SUMMARY OF THE INVENTION

Applicant recognizes the need for a step function progress in package coherence and reliability of the ever-shrinking QFN and SON semiconductor devices. Applicant's approach is to lock mechanically the small metal lands in the plastic package mutually so that they are fixed in their respective positions in all three dimensions, preventing any shifting or sliding, tilting, or pulling-out.

One embodiment of the invention is a plastic semiconductor device with a surface including a linear array of metal lands. Each land has a perimeter including parallel perimeter portions; adjacent lands have their parallel perimeter portions parallel to each other, defining a centerline. The lands have flanges remote from the surface, each flange shaped by an outline. For adjacent lands, the flanges of the parallel perimeter portions have asymmetrical outlines relative to the centerline. The space between the asymmetrical outlines is filled with plastic material, anchoring the adjacent lands together to hinder any land shifts.

In another embodiment of the invention, the asymmetrical flange outlines of adjacent lands are in concord so that the flange of one land diminishes its outline where the flange of the adjacent land protrudes its outline, shaping the space between the adjacent flanges in a meander-like mode. The plastic material anchored in the meander-like space locks adjacent lands together to hinder a land shift along the parallel perimeter portions. In another embodiment, the flange outlines of a pair of adjacent lands are so asymmetrical that the outline for the first land can protrude strongly while the coordinated outline of the second land has to recess into the width of the second land.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1A:
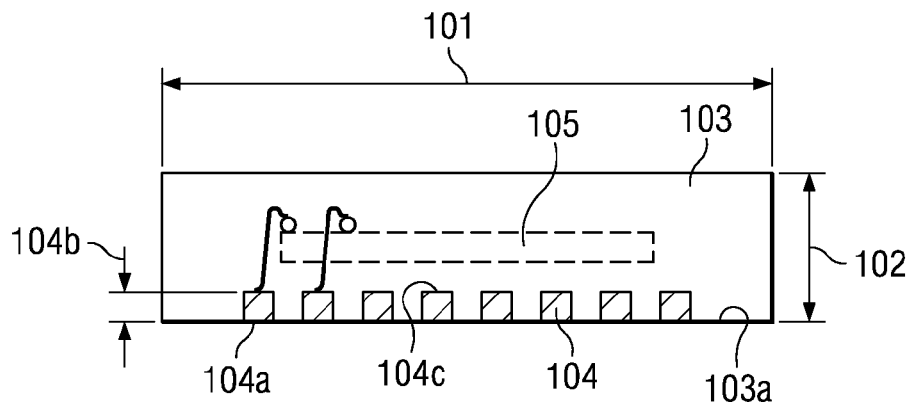
FIG. 1A is a schematic side view of a plastic semiconductor package of a typical SON/QFN type.
Figure 1B:
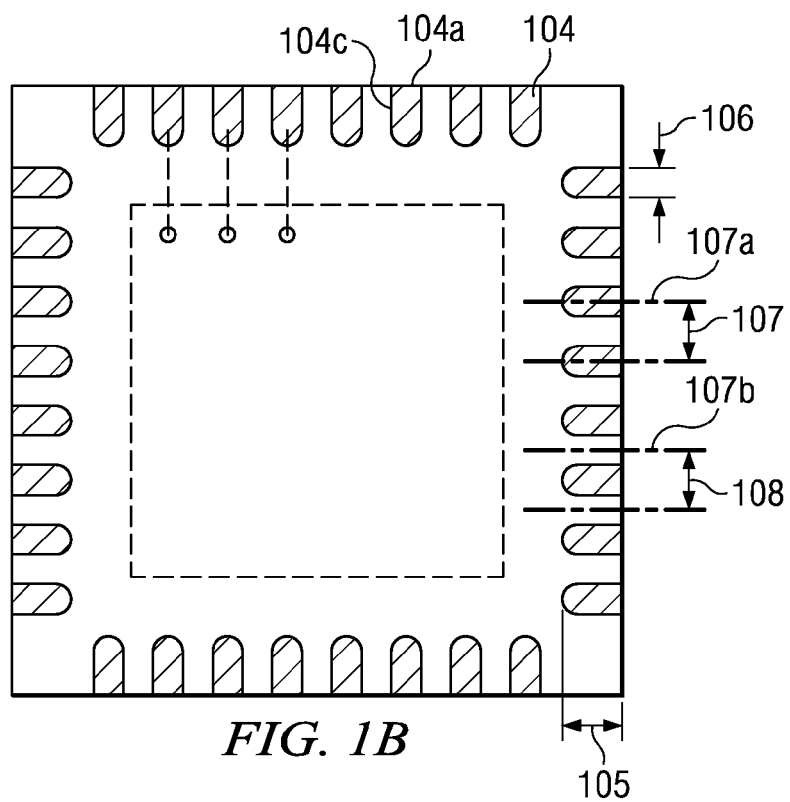
FIG. 1B is a schematic bottom view of a plastic package of a typical SON/QFN type, with the embedded chip shown in dashed outlines.

The embodiments of the invention are especially useful for devices of the plastic Quad Flatpack No-lead (QFN) and Small Outline No-Lead (SON) families. These devices may exhibit a wide variety of shapes and compositions to be used as versatile components for hand-held products, wireless equipment, and numerous other applications. FIG. 1A is a schematic side view and FIG. 1B is a schematic bottom view of a semiconductor plastic QFN device with the lateral dimension 101 of about 5.0 mm and the thickness 102 of about 0.8 mm. While the device of FIG. 1B is shaped as a square, it should be pointed out that QFN/SON devices may also be shaped as rectangles. The material 103 of the device is typically a molding compound, but may be any other type of plastic encapsulation compound. The plastic material has a bottom planar surface 103a.

A row of metal contact pads, or lands, 104 is arrayed along the edge of the device. The lands may have a thickness 104b of 0.2 mm. In FIG. 1A, the first metal surface 104a of the lands is substantially coplanar with plastic surface 103a. The number of lands varies greatly from device type to device type; in FIG. 1A, the depicted example has 8 lands along one perimeter edge; as FIG. 1B shows, the total device has 32 lands.

In many QFN/SON devices such as the example shown in FIG. 1B, metal lands 104 are spaced in rows along the sides of the device. In the example of FIG. 1B, the length of a row may be 3.5 mm. The land surfaces 104a may have a variety of contours; in FIG. 1B, the pads are elongated with a length 105 of 0.5 mm. Further, the lands are shaped by a perimeter with parallel portions 104c, which are spaced by distance 106 of about 0.3 mm from each other. Lands with contours shapes as depicted in FIG. 1B can be thought of as having a symmetry line 107a; in FIG. 1B, the spacing 107 of the symmetry lines of adjacent lands is about 0.5 mm. Further, for a repetitive land array as shown in FIG. 1B, it may be useful to define a centerline 107b between the parallel portion of the land perimeters and then to specify the distance 108 between adjacent center lines.

A semiconductor chip 105 is encapsulated in package 103. It is shown in FIGS. 1A and 1B in X-ray fashion with dashed outlines. Alternatively, there may be more than one chip encapsulated in plastic material 103. Also with dashed contours are depicted a few of the wire bonds, which electrically connect the chip to the second surface 104c of the metal pads. Not shown in FIG. 1B is a thermal pad, which is often employed to enhance the thermal and mechanical performance of many devices. The pad has a surface substantially coplanar with the package surface and is made of metal with a solderable surface. Enlarged lengths of FIGS. 1A and 1B are depicted in FIGS. 2A and 2B.

Figure 2A:
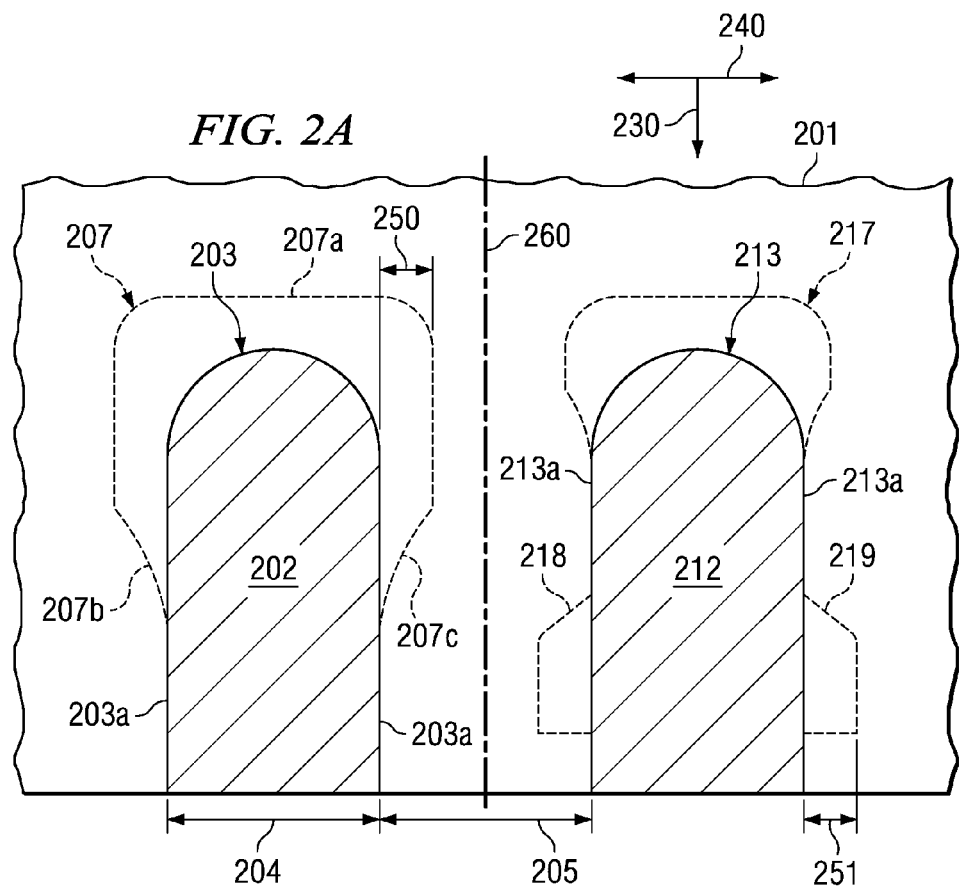
FIG. 2A is a schematic bottom view of a portion of a plastic semiconductor package showing the surface of adjacent metal lands with flanges (dashed) remote from the surface, the flanges shaped according to an embodiment of the invention.
Figure 2B:
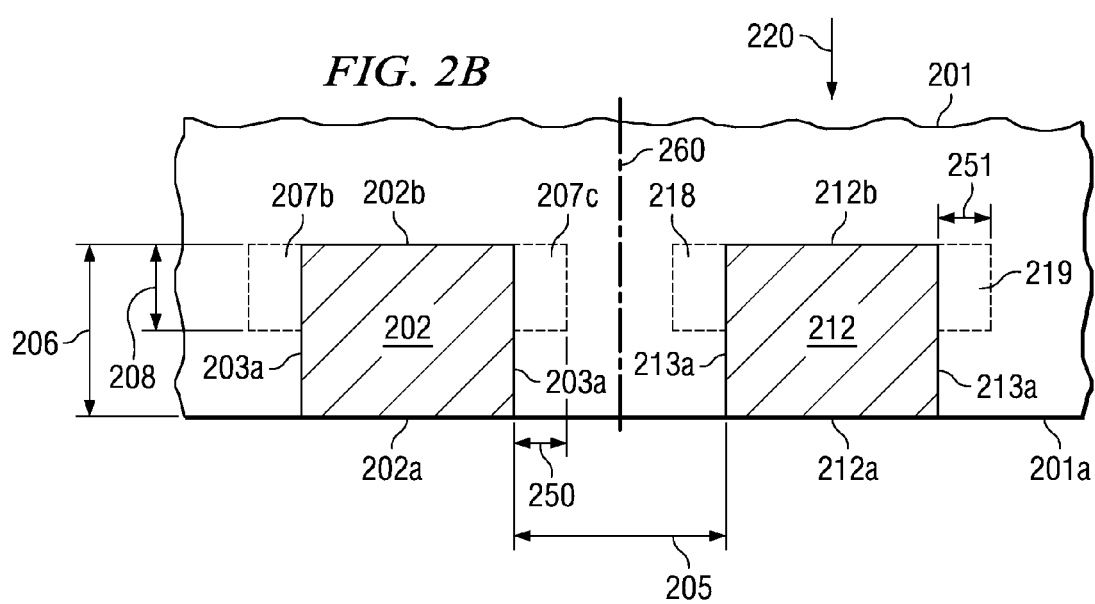
FIG. 2B is a schematic side view of a portion of a plastic semiconductor package showing the ends of adjacent metal lands with flanges (dashed) remote from the side surface, the flanges shaped according to an embodiment of the invention.

An embodiment of the invention is illustrated in the semiconductor device portions FIGS. 2A and 2B. The top view of FIG. 2A shows the planar surface of the plastic device material 201. Preferably, material 201 is a molding compound; alternatively, it may be any other plastic encapsulation material. Embedded in the plastic is a plurality of metal lands, spaced in a linear array. FIG. 2A depicts land 202 and land 212 adjacent to each other. The lands are preferably made of copper or copper alloy and have a width 204 between about 150 and 300 μm, with a preferred width of about 200 μm; smaller as well as greater widths can be made. The (first) surface of lands 202 and 212 is substantially coplanar with the plastic surface, and may be suitable for solder attachment (the first surface is designated 202a and 212a in FIG. 2B, the second surface 202b and 212b, respectively). An example is a first surface with a layer of nickel and an outermost surface of gold, or an outermost layer of palladium.

Land 202 has a perimeter 203, which includes parallel portions 203a; land 212 has a perimeter 213, which includes parallel portions 213a. The parallel portions of the land perimeter have a length between about 0.2 and 0.7 mm. The parallel portions 203a and 213a of a pair of adjacent lands 202 and 212 are oriented in parallel; a centerline 260 is defined herewith. As FIG. 2A shows, the parallel portions 302a and 213a, which are facing each other, have a distance 205. (As used herein, the "distance" denotes the shortest distance between adjacent lands.) As an example, distance 205 may be between about 200 and 350 μm; however, smaller as well as greater distances may be used.

FIG. 2B illustrates a side view of the portion of a semiconductor device with a pair of adjacent lands 202 and 212; the lands are embedded in plastic material 201 with its planar surface 201a. The metal of both lands has a thickness 206 between about 100 and 300 μm, preferably about 150 μm. FIG. 2B shows land 202 having parallel perimeter portions 203a, and land 212 having parallel perimeter portions 213a. The separation of the parallel land perimeters is designated 205, same as in FIG. 2A; the centerline between the parallel portions is designated 260. It is preferred that the distance between parallel perimeter portions of adjacent lands is approximately equal to the land thickness. In the example of FIG. 2B, the surface 202a of metal land 202 and the surface 212a of metal land 212 are substantially coplanar with the surface 201a of the plastic encapsulation of the device.

FIGS. 2A and 2B depict metal flanges protruding from the land perimeters; each flange is shaped by an outline. These flanges are remote from surface 201a (and thus illustrated by dashed outlines) in order to have compound 201 act as a lock for the lands and thus prevent any movement of the metal in the direction indicated by arrow 220. In FIG. 2A, land 202 has flange 207, including portions 207a, 207b, and 207c. Land 212 has flanges 217, 218, and 219. The side view of FIG. 2B shows the dashed flange portions 207b and 207c of land 202, and flanges 218 and 219 of land 212. The flanges have a thickness 208 between about 50 and 150 μm, with a preferred thickness of about 75 μm, or half of land thickness 206.

Flange portion 207c and flange 218 of the adjacent land 202 and 212 are preferably spaced by equal or less distance than the perimeter distance 205. As FIG. 2A illustrates, the flange widths of the parallel perimeter portions of adjacent lands (207c and 218) are dissimilar; the flange outlines are asymmetrical relative to the centerline 260. This asymmetry is coordinated, or in concord, so that the flange of one land diminishes (sometimes to zero) its outline where the flange of the adjacent land protrudes its outline. In this manner, the concord of flanges of a pair of adjacent lands includes alternating flange positions along the parallel perimeter portions of adjacent lands. As an example, flange 218 of land 212 protrudes, while the flange of the adjacent perimeter 203a of land 202 vanishes. Alternately, flange 207a of land 202 protrudes, while the flange of the adjacent perimeter 213a of land 212 vanishes. Consequently, the space between the adjacent flanges is shaped in a meander-like mode.

As numerical examples, flange width 250 of land 202 and flange width 251 of land 212 are between about 25 and 75 μm; preferably, flange widths 250 and 251 are about 50 μm. In some devices such as the examples shown in FIGS. 4A and 4B, and 5A and 5B, the protruded flanges may have a width between about 50 and 100 μm. On the other hand, the shrunken flange has often a width of 0 μm. In some devices such as the examples shown in FIGS. 4A and 4B, and 5A and 5B, the shrunken flange may be recessed between about 40 and 70 μm into the width of the land. Consequently, the concord of flanges of adjacent lands includes increased extension for the flange of one land by recessing the adjacent land.

As a result of the rhythmic, synchronized variation of the flange widths, the flange spacing shapes the space between the adjacent flanges in a meander-like mode. The variable gaps form a meander-like space between adjacent lands; the space between the asymmetrical outlines of adjacent lands appears castellated.

In the fabrication process flow of the device, the semiconductor chip is assembled with the lands (originally provided as parts of a metal leadframe), including for example the wire bonding indicated in FIGS. 1A and 1B. Thereafter, plastic adhesive encapsulation material, such as molding compound, is filling the spaces surrounding the chip and the leadframe parts; in this process, the space between the asymmetrical flange outlines of adjacent lands is filled with plastic adhesive material 201. As a result, the material becomes anchored in the variable, meandering gaps between adjacent lands, and can thus operate to hinder a land shift along the direction indicated by arrow 230 (direction of the parallel perimeter portions), and, to a lesser extent, along the direction indicated by arrows 240. The adhesive plastic material anchored in the meander-like space locks adjacent lands together. Since the directions indicated by arrows 240, 230 and 220 represent the x-, y-, and z-directions of the device, the coordinated designs of the land flanges provide the metal lands of the QFN/SON devices with reliable anchoring in the encapsulation material and relative to each other.

Experience has shown that the anchored lands do not noticeably move in the x-, y-, or z-direction, for instance under the thermomechanical stresses exerted by the soldering process of assembling the device lands on external board pads.

Figure 3A:
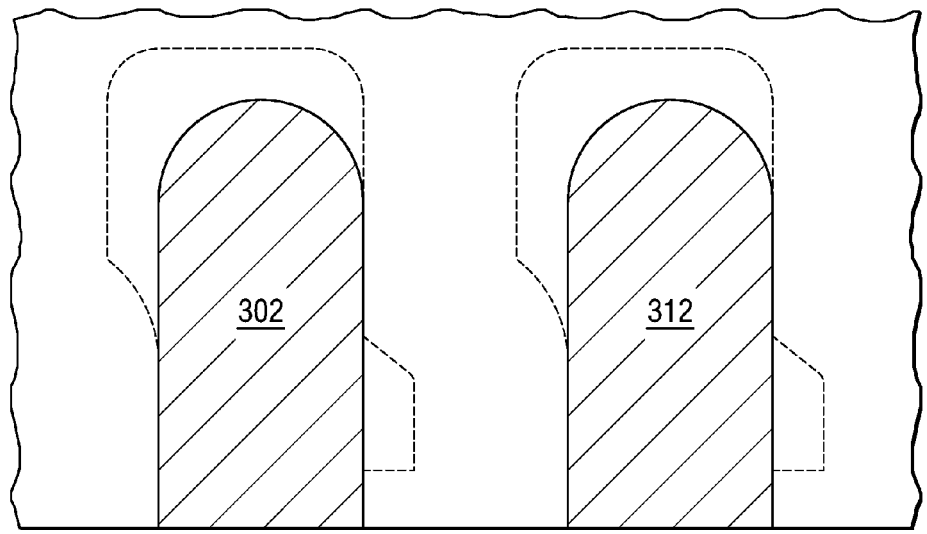
FIG. 3A is a schematic bottom view of a portion of a plastic semiconductor package showing the surface of adjacent metal lands with flanges (dashed) remote from the surface, the flanges shaped according to another embodiment of the invention.
Figure 3B:
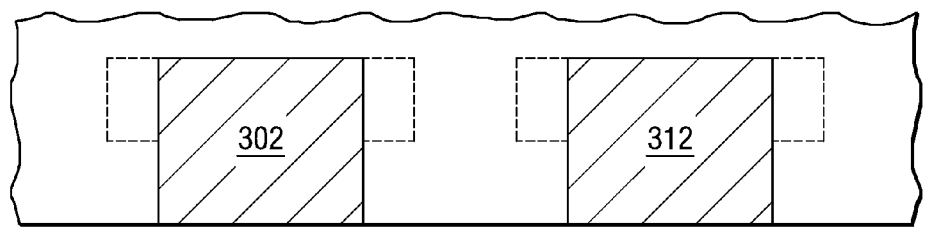
FIG. 3B is a schematic side view of a portion of a plastic semiconductor package showing the ends of adjacent metal lands with flanges (dashed) remote from the side, the flanges shaped according to another embodiment of the invention.

FIGS. 3A and 3B depict another embodiment of the invention. While it is similar to the embodiment described in FIGS. 2A and 2B, also with regard to the dimensions, it offers asymmetrical yet identical flange distributions for the pair of lands 302 and 312, resulting in constant distances between the flanges of the adjacent lands. Consequently, the flange design of FIGS. 3A and 3B is particularly suited for miniaturizing the pitch between the lands.

As stated above, the lands are supplied by metal leadframes. The preferred method of fabricating the leadframes is an etching technique, which starts with a continuous sheet of metal. The sheet surfaces have different mask protection, but are etched concurrently, while the sheet is processed through a metal etch bath. Typically, there is an etch tolerance of 25 μm on each side of a land, resulting in a total etch tolerance of 50 μm. With the premise of these etch tolerances, the shrinking feature sizes is a challenge so that a symmetrical feature distribution as shown in FIGS. 3A and 3B is particularly welcome.

Figure 4A:
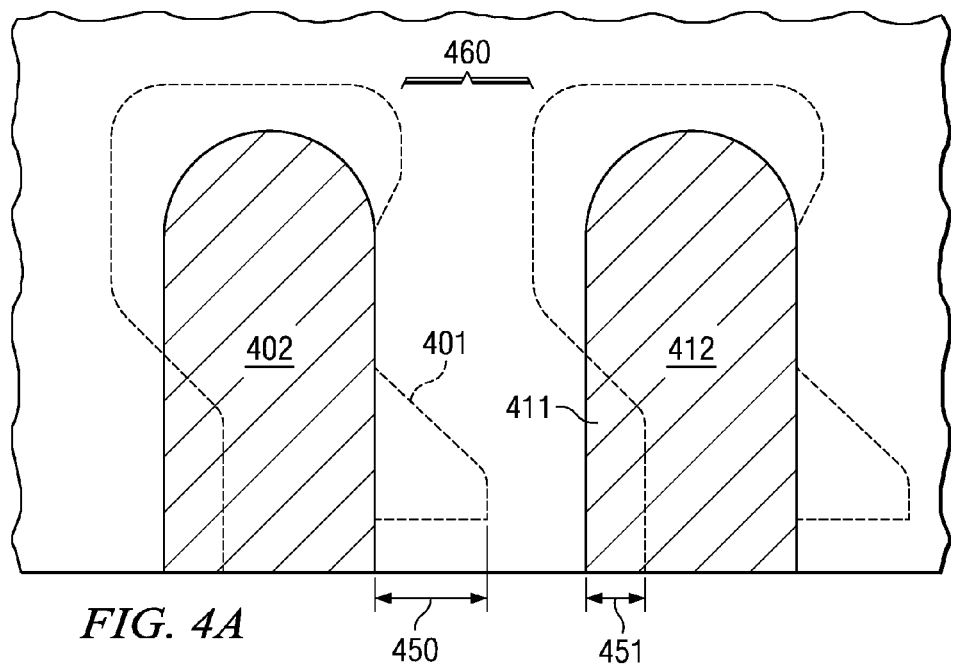
FIG. 4A is a schematic bottom view of a portion of a plastic semiconductor package showing the surface of adjacent metal lands with flanges (dashed) remote from the surface, the flanges shaped according to another embodiment of the invention.
Figure 4B:
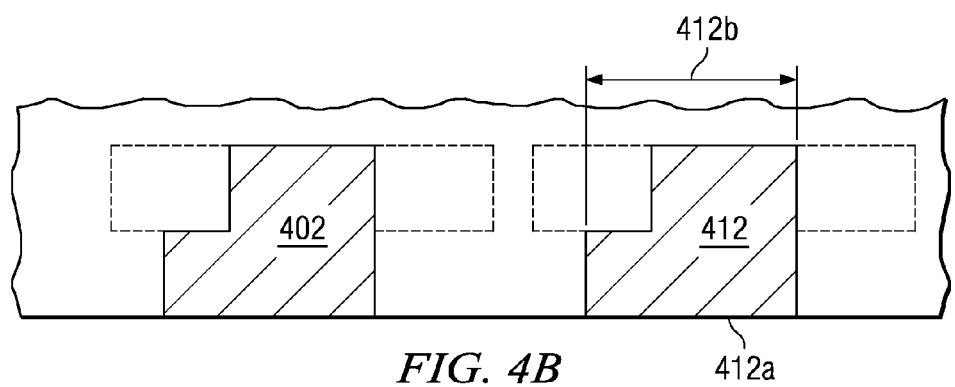
FIG. 4B is a schematic side view of a portion of a plastic semiconductor package showing the ends of adjacent metal lands with flanges (dashed) remote from the side, the flanges shaped according to another embodiment of the invention.

The embodiment depicted in FIGS. 4A and 4B uses a flange design, which is identical for adjacent lands, but in addition aims at amplifying the resulting meander-like shape of the space 460 between adjacent lands. As a result, the anchoring effect of the plastic compound filling that space becomes particularly strong.

The embodiment achieves the strong meandering of the space between adjacent lands by designing the flange protrusion 401 of the first land 402 extra wide and providing the needed space by sacrificing a portion 411 of the land metal of the second land 412. The increased extension of the flange of land 402 is in concord with the recess of the adjacent land 412. As an example, for the dimensions of a device as described in FIGS. 1A and 1B, protrusion 401 may have a width 450 between about 75 and 100 μm or more, and the recess 451 may have a depth between about 50 and 75 μm or more.

The recessing of lands 412 and 402 does not affect the functionality of these lands with regard to solder attachment, since surface width 412a (preferred width of about 200 μm in FIGS. 2A and 2B) remains available. Nor does it affect their functionality with regard to wire bond attachment, since surface width 412b (also about 200μm together with the flange width) remains available.

Figure 5A:
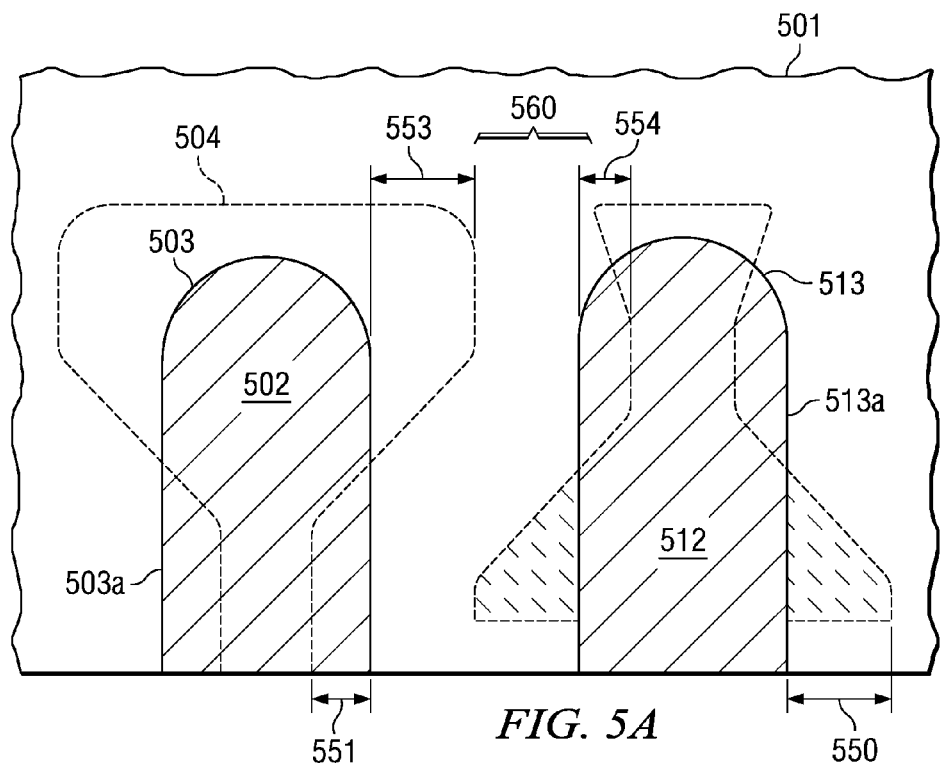
FIG. 5A is a schematic bottom view of a portion of a plastic semiconductor package showing the surface of adjacent metal lands with flanges (dashed) remote from the surface, the flanges shaped according to another embodiment of the invention.
Figure 5B:
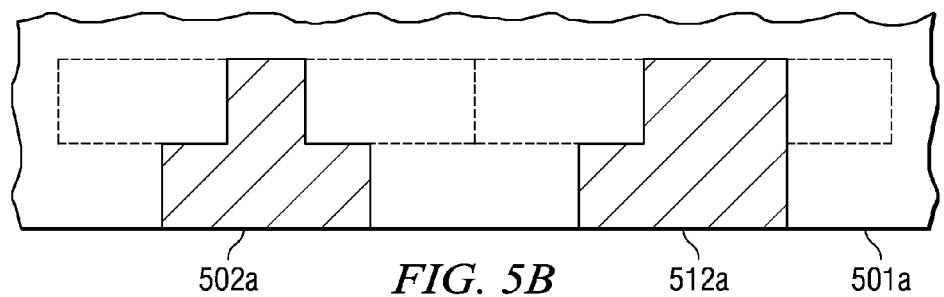
FIG. 5B is a schematic side view of a portion of a plastic semiconductor package showing the ends of adjacent metal lands with flanges (dashed) remote from the side, the flanges shaped according to another embodiment of the invention.

The embodiment illustrated in FIGS. 5A and 5B employs an elaborate asymmetrical flange design to achieve a strongly curved meander-like shape of the space 560 between adjacent lands. As a result, the anchoring effect of the plastic compound filling that space can be maximized.

Adjacent metal lands 502 and 512 still have respective surfaces suited for solder attachment (the surfaces are shown top-view in FIG. 5A, but reduced to lines 502a and 512a in side-view of FIG. 5B). However, remote from the surface 501a of the plastic encapsulation compound 501 are two land and flange features to provide a pronounced meander-like shape for the space between the lands and thus to achieve strong anchoring for the encapsulation compound. In the first feature, along the parallel portions 503a and 513a of the land perimeters, the increased extension for the flange of land 512 is in concord with the recess of the adjacent land 502. In the second feature, in the end portions 503 and 513 of the land perimeters, the design is alternated by increasing the flange of land 502 in coordination with recessing the adjacent land 512.

An example of the first feature is depicted in FIG. 5A. The parallel portions 513a of the perimeter of land 512 have two flange protrusions of large size; the flanges are symmetrical relative to land 512 and shown in dotted lines due to their recess from surface 501a (see also FIG. 5B). For the dimensions of a device as described in FIGS. 1A and 1B, width 550 of a flange protrusions of land 512 may range from about 75 to 100 μm or larger. Size and shape of the protrusions are coordinated with a flange shrink or recess of adjacent land 502. Since the flange protrusions of land 512 are symmetrical, the recesses of land 502 are also symmetrical. Recess 551 of land 502, in concord with protrusion 550, may range from about 50 to 75 μm or more.

An example of the second feature is also depicted in FIG. 5A. The end portion 503 of the perimeter of land 502 has a large flange protrusion 504 of width 553, symmetrical relative to land 502. Width 553 may range from about 100 to 125 μm or more. Size and shape of protrusions 504 are coordinated with a flange shrink or recess of adjacent land 512. Since the flange protrusions 504 of land 502 are symmetrical, the recesses of land 512 are also symmetrical. Recess 554 of land 512, in concord with protrusion 553, may range from about 50 to 75 μm or more.

An additional benefit of the large-size flange 504 is the fact that it facilitates wire bonding (stitch or ball) on land 502. On the other hand, flange recessing for land 512 does not diminish the functionality with regard to wire bond attachment, because stitch (and ball) bonds can easily be placed on the land area enlarged by the protrusions.

The functionality of lands 502 and 512 with regard to solder attachment is not affected by the land-locking features of the flanges, since surface width 512a (see FIG. 5B; width between about 150 to 300 μm, preferred width of about 200 μm) remains unchanged and fully available.

Embodiments, which exploit land flange designs as shown in FIGS. 4A/4B, and 5A/5B, increase the space needed for the enlarged flanges by reducing the width of the land metal remote from the surface, either repetitive relative to adjacent lands (FIGS. 5A/5B), or non-repetitive relative to adjacent lands (FIGS. 4A/4B). This approach can be applied even to devices, which can have a land pitch center-to-center of only 0.4 mm or less. Consequently, the embodiments described support the trend towards miniaturization of semiconductor packages, while simultaneously supporting increased robustness against thermo-mechanical stresses and package delamination.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the adhesive plastic materials interlocking adjacent lands may be thermosetting or thermoplastic materials. As another example, the solderable land surface may be coplanar with the plastic surface, or not coplanar. It is therefore intended that the appended claims encompass any such modifications or embodiments.

We claim:

1. A semiconductor device comprising:
   a semiconductor chip encapsulated in a package of plastic material;
   the plastic package having a planar surface area;
   metal lands in the plastic material spaced in a linear array, the lands having a first surface
      substantially coplanar with the plastic surface, and a second surface inside the package, the second surface electrically connected to the chip;
   each land having a perimeter including parallel portions;
   pairs of adjacent lands having their facing parallel perimeter portions oriented in parallel, defining a centerline;
   the lands having flanges remote from the first surface, each flange shaped by an outline;
   the flanges along the parallel perimeter portions of adjacent lands having asymmetrical outlines relative to the centerline; and
   the space between the asymmetrical outlines filled with the plastic material.

2. The device according to claim 1 wherein the metal lands are made of copper or copper alloy and have a thickness between about 100 and 300 μm and a preferred thickness of about 150 μm.

3. The device according to claim 1 wherein the land surface is solderable.

4. The device according to claim 1 wherein the parallel portions of the land perimeter have a length between about 0.2 and 0.7 mm.

5. The device according to claim 1 wherein the metal lands have a width between about 150 and 300 μm and a preferred width of about 200 μm.

6. The device according to claim 2 wherein the distance between parallel perimeter portions of adjacent lands is approximately equal to the land thickness.

7. The device according to claim 1 wherein the flanges have a thickness between about 50 and 150 μm and a preferred thickness of about 75 μm.

8. The device according to claim 1 wherein the flanges have a width between about 25 and 75 μm.

9. The device according to claim 1 wherein the flanges have a width of about 50 μm.

10. The device according to claim 1 wherein the asymmetrical flanges of a pair of adjacent lands have a width between about 50 and 100 μm for one land in concord with between about 50 to 0 μm for the other land.

11. The device according to claim 1 wherein the asymmetrical flanges of a pair of adjacent lands have a width more extended for one land in concord with less recess into the width of the other land.

12. The device according to claim 1 wherein the surface area is surrounded by edges and the linear array of metal lands is along an edge.

13. A semiconductor device comprising:
   a semiconductor chip connected to metal lands disposed in a linear array;
   each metal land having a base portion and a first flange portion connected to the base portion;
   the flange portion having a first peripheral outline;
   the base portions of two adjacent lands defining a center line equal distant from the base portions; and
   the first peripheral outlines of the two adjacent lands being asymmetrical with respect to the center line.

14. The device of claim 13, in which the flange portions of the lands in the linear array are of the same shape.

15. The device of claim 13, in which the flange portion of two adjacent lands are of different shapes.

* * * * *